United States Patent
Foster, Sr. et al.

(10) Patent No.: US 7,106,595 B2
(45) Date of Patent: Sep. 12, 2006

(54) APPARATUS INCLUDING A THERMAL BUS ON A CIRCUIT BOARD FOR COOLING COMPONENTS ON A DAUGHTER CARD RELEASABLY ATTACHED TO THE CIRCUIT BOARD

(75) Inventors: Jimmy Grant Foster, Sr., Morrisville, NC (US); Michael S. June, Raleigh, NC (US); Albert Vincent Makley, Raleigh, NC (US); Jason Aaron Matteson, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 171 days.

(21) Appl. No.: 10/941,361

(22) Filed: Sep. 15, 2004

(65) Prior Publication Data
US 2006/0056154 A1  Mar. 16, 2006

(51) Int. Cl.
*H05K 7/20* (2006.01)

(52) U.S. Cl. ............... 361/721; 361/688; 361/715; 361/716; 165/80.3; 439/485; 439/487

(58) Field of Classification Search ........... 361/688, 361/704, 714–716, 719–721; 257/712; 165/80.3; 174/16.1, 16.3; 439/485, 487
See application file for complete search history.

(56) References Cited

U.S. PATENT DOCUMENTS

| 5,109,318 | A | * | 4/1992 | Funari et al. ............. 361/710 |
| 5,784,263 | A | * | 7/1998 | Nelson .................... 361/785 |
| 5,815,371 | A | * | 9/1998 | Jeffries et al. ............. 361/704 |
| 5,966,287 | A | * | 10/1999 | Lofland et al. ............ 361/704 |
| 6,025,992 | A | | 2/2000 | Dodge et al. |
| 6,287,609 | B1 | * | 9/2001 | Marlett et al. ............ 424/738 |
| 6,388,882 | B1 | | 5/2002 | Hoover et al. |
| 6,449,161 | B1 | * | 9/2002 | Duesman et al. ......... 361/719 |
| 6,657,121 | B1 | | 12/2003 | Garner |
| 6,696,754 | B1 | * | 2/2004 | Sato et al. ................ 257/723 |
| 6,775,139 | B1 | * | 8/2004 | Hsueh ..................... 361/697 |
| 6,796,831 | B1 | * | 9/2004 | Yasufuku et al. ......... 439/485 |
| 6,888,719 | B1 | * | 5/2005 | Janzen et al. ............. 361/687 |
| 6,930,889 | B1 | * | 8/2005 | Harrison et al. .......... 361/774 |
| 2003/0000721 | A1 | | 1/2003 | Garner |
| 2003/0035269 | A1 | | 2/2003 | Chin |
| 2003/0076657 | A1 | | 4/2003 | Summers et al. |
| 2004/0045730 | A1 | | 3/2004 | Garner |

FOREIGN PATENT DOCUMENTS

JP  11087967  3/1999

OTHER PUBLICATIONS

Tab Sink, IBM Technical Disclosure Bulletin, Aug. 1990, pp. 158-160.

* cited by examiner

*Primary Examiner*—Boris Chérvinsky
(74) *Attorney, Agent, or Firm*—Ronald V. Davidge; Cynthia S. Byrd

(57) ABSTRACT

A daughter card includes a number of circuit modules generating heat and a spring member transmitting the heat to a thermal bus extending along a circuit board adjacent to one side or to each side of a connector to which the daughter card is releasably attached. One or more contact surfaces of the spring member releasably contact one or more mating surfaces of a thermal bus at a side of the connector or at both sides of the connector. A heat pipe may additionally be used to direct heat from the thermal bus to a heat absorber.

30 Claims, 3 Drawing Sheets

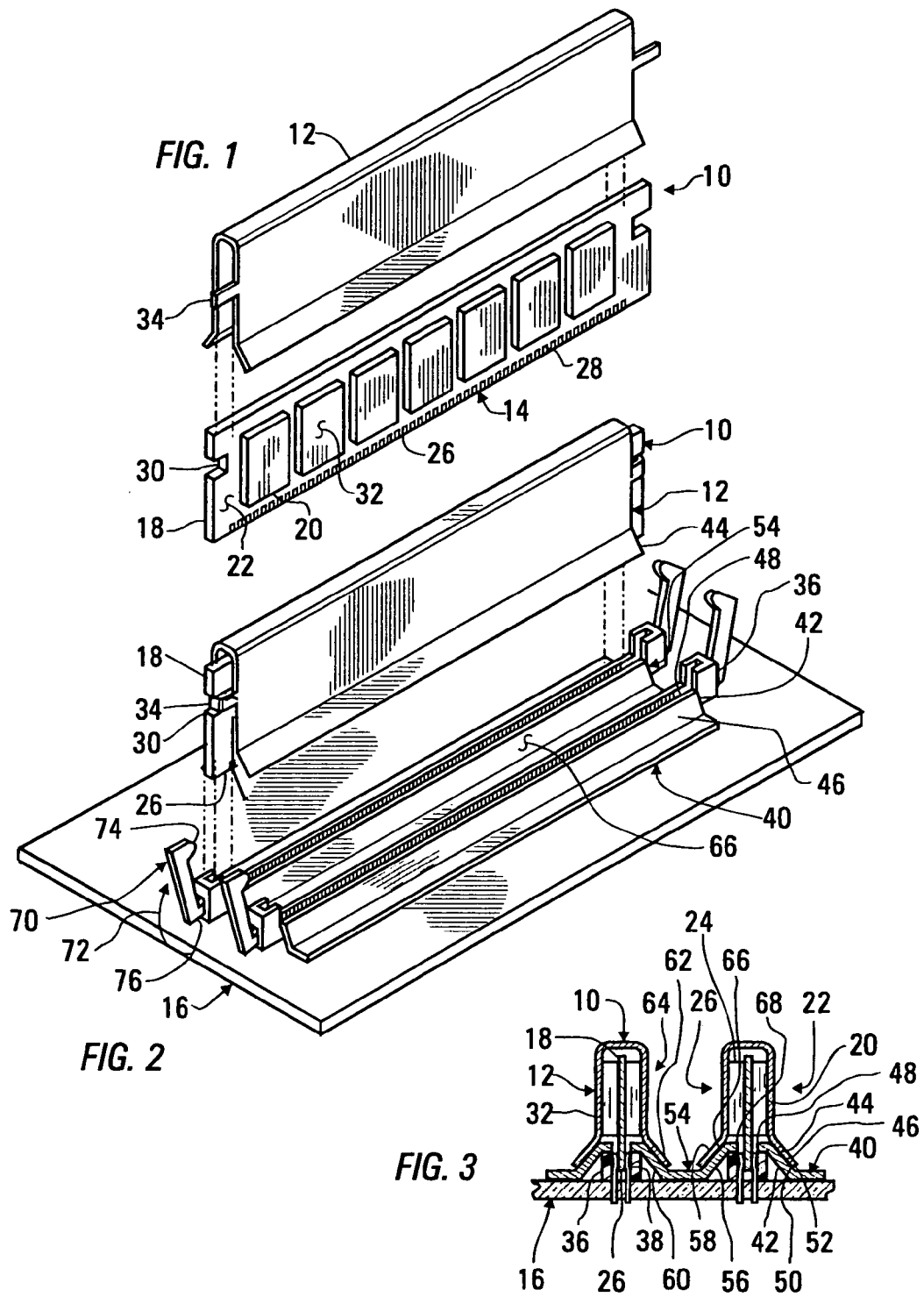

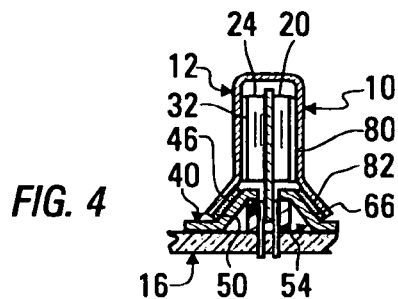
FIG. 4
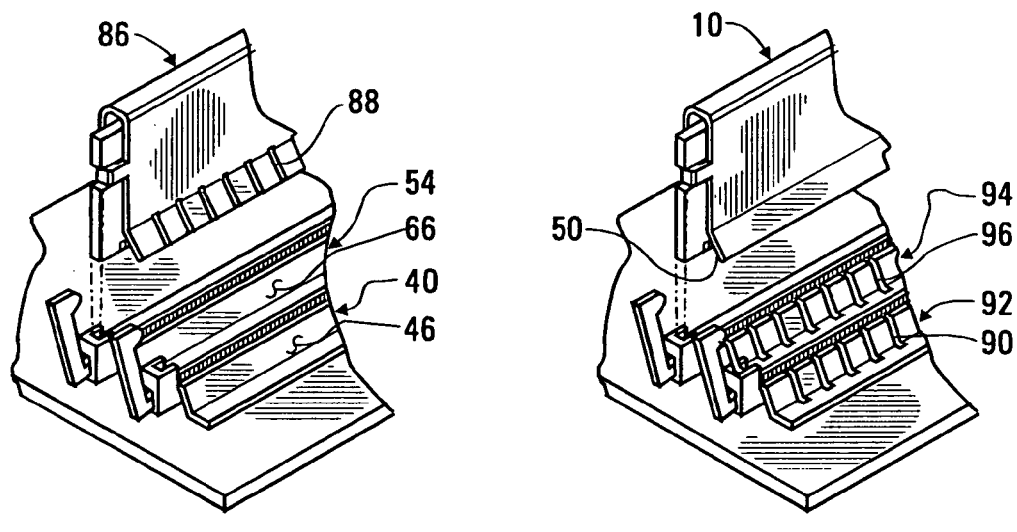
FIG. 5
FIG. 6
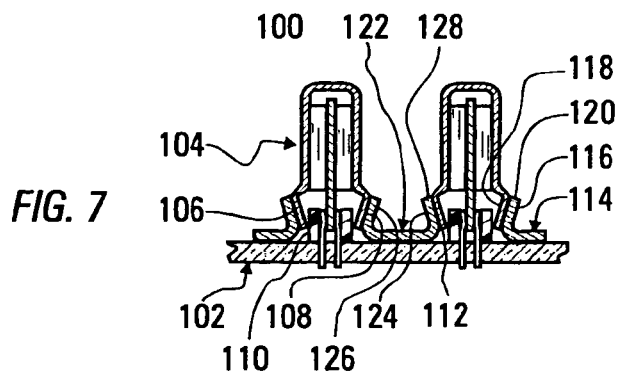
FIG. 7

APPARATUS INCLUDING A THERMAL BUS ON A CIRCUIT BOARD FOR COOLING COMPONENTS ON A DAUGHTER CARD RELEASABLY ATTACHED TO THE CIRCUIT BOARD

BACKGROUND OF THE INVENTION

1. Field of the Invention

This invention relates to the cooling of electronic components mounted on a daughter card that is releasably connected to a circuit board and, more particularly, to the cooling of memory modules within a DIMM package attached to a circuit board.

2. Background of the Invention

Current computing systems, including personal computers and servers, contain system memory built in accordance with a packaging system called DIMM (Dual In-line Memory Modules).

Increases in the operating speed of microprocessors are pushing the requirements for the speed at which data is written to and read from system memory to levels not previously achieved. Furthermore, a long-term trend has been the realization of dramatic increases in the memory capacity that can occupy a particular space within a computing system. Both of these effects increase the rate at which heat must be dissipated, with the changes in memory speed that are occurring now driving the power that must be dissipated as heat for each DIMM memory module to levels twice as high as the levels achieved as recently as about two years ago. While cooling systems within personal computers and servers can currently dissipate 10 to 12 watts per DIMM module, it is anticipated that in the near future requirements will be made for dissipating 16 to 25 watts per DIMM module.

U.S. Pat. App. Pub. Ser. 2003/0076657 A1 describes a number of structures for dissipating heat from modules attached to elongated daughter cards, such as DIMM memory modules. Formed clamping structures extend over the modules, being held against the modules to facilitate the transfer of heat. In various configurations, heat is dissipated by structures also extending along both sides of the daughter card, such as elongated structures including corrugations or fins increasing the surface area available for heat dissipation. In one configuration, the clamping structure includes a number of resilient fingers extending outward from the end of the daughter card opposite the end at which it is removably connected from the circuit board, with these resilient fingers being staggered so that daughter cards so equipped can be installed in close proximity. These fingers are held in contact with a structure forming a thermal mass that absorbs heat generated by the modules. The daughter cards thus extend between the structure forming a thermal mass and the circuit board, so that the structure must be removed before one of the daughter cards can be removed or installed at one of the connectors on the circuit board. However, since daughter cards with memory modules are often removed and installed by the user of a computer system to upgrade the available memory, it is particularly important to retain the simplicity of removing and installing such daughter cards. Thus, what is needed is a system providing for the transfer of heat to a structure extending away from the daughter cards without requiring the removal of the structure before a daughter card can be removed or installed.

U.S. Pat. No. 6,025,992 also describes a circuit card unit comprising a memory card and an attached heat exchanger including a thin, flexible laminated strip of foil clad plastic, affixed in thermally conductive contact to each card module and extended therefrom to facilitate the removal of heat from the modules. In some embodiments, the exchanger strip extends from the modules on one side of the card to those on the other side in a self-supporting heat exchanger loop spaced over the memory card. In a somewhat more compact embodiment, the strip extends from modules on one card face, along the card itself, to the modules of the other card face. In still another embodiment, the heat exchanger strip extends from the modules of the card to a heat sink, such as the housing of the computer. What is needed is a heat exchanger fastened to the circuit card to carry heat from the circuit modules to a thermal bus in an arrangement that is connected and disconnected as the circuit card is connected and disconnected from the circuit board. Such a connection could be readily made and accurately re-established without concern for changes in the position of the circuit card relative to another structure in the computer, such as its housing.

The literature additionally includes a number of other examples of descriptions of apparatus, such as a thermal bus, for conducting heat away from the electronic components in which it is generated to other parts of a system. For example, U.S. Pat. No. 6,657,121 and U.S. Pat. App. Pub. Nos. 2003/0000721 A1 and 2004/0045730 A1 describe thermal energy management systems each having a heat spreading device that is operatively engaged with at least one semiconductor chip and a thermal bus operatively engaged with the heat spreading device to transport thermal energy from the heat spreading device to a heat sink. The heat spreading device includes a heat pipe, and the thermal bus includes a loop thermosyphon. U.S. Pat. No. 6,388,882 describes a system having a hierarchical scheme in which thermal management components are operatively engaged with individual portions of a system of electronic components and subsystems and in which the thermal management components are substantially only thermally driven, including, for example, heat transfer devices that have no moving parts, requiring no external power for their operation. Japanese Pat. No. 11087967 describes a system in which a heat exchanging part and a heat receiving part, separately arranged on a circuit board, are thermally connected by a heat pipe and by a ground layer of the circuit board. U.S. Pat. App. Pub. No. 2003/0035269 A1 describes a thermal bus for carrying heat from a die of an integrated circuit to a heat dissipating device such as a heat sink, forming a path for the removal of heat in addition to the traditional path through the surface of the die nearest the heat sink. The IBM Technical Disclosure Bulletin, August, 1990, pp. 158–160 describes thermally conductive and dissipative structures fabricated on a metal tape having the same format as a bonding tape, which are used for cooling VLSI chips. The structures all include a square central area that is attached to the chip and four generally trapezoidal wings that extend either up or down from the chip.

Again, what is needed is apparatus for transferring heat from circuit modules on a daughter card releasably attached to a thermal bus carrying heat away from the daughter card.

SUMMARY OF THE INVENTION

In accordance with a first aspect of the invention, a circuit board is provided, including a first connector and a first thermal bus. The first connector, which is for removably engaging a connection edge of a daughter card, has a plurality of contact terminals for contacting a plurality of contact terminals of the daughter card. The first thermal bus extends adjacent a first side of the first connector, having a thermal contact structure for removably engaging a thermal contact structure of a daughter card held within the first connector.

According to another aspect of the invention, a daughter card is additionally provided. The daughter card includes the connection edge, a plurality of contact terminals extending along the connection edge, a circuit module, and a spring member extending along a surface of the circuit module to absorb heat from the circuit module. The spring member includes a thermal contact structure extending adjacent the connection edge.

Preferably, a first plurality of circuit modules are disposed along a first side of the daughter card, while a second plurality of circuit modules are disposed along the second side, opposite the first side, of the daughter card. The spring member then includes a first side extending along the first side of the daughter card outwardly from the first plurality of circuit modules and a second side extending along the second side of the daughter card outwardly from the second plurality of circuit modules. The circuit board then additionally includes a second thermal bus extending along a second side, opposite the first side, of the first connector. While the first thermal bus has a thermal contact structure for engaging a thermal contact structure extending along the first side of the circuit card engaged within the first connector, the second thermal bus has a thermal contact structure for engaging a thermal contact structure extending along the second side of this circuit card.

The circuit board may further include a second connector, arranged in a spaced apart relationship with the first connector. The second thermal bus then extends between the first and second connectors, with thermal contact structures of the second thermal bus being arranged to engage thermal contact structures of daughter cards held within both the first and second connectors. The circuit board may additionally include a heat pipe attached to transfer heat from each of the thermal buses to a heat absorber.

BRIEF DESCRIPTION OF THE DRAWINGS

FIG. 1 is a perspective view of a daughter card built in accordance with a first embodiment of the invention, showing a spring member in an exploded relationship with a circuit card assembly;

FIG. 2 is a perspective view of the daughter card of FIG. 1 in an exploded relationship with a circuit board built in accordance with the first embodiment of the invention;

FIG. 3 is a fragmentary transverse cross-sectional view of the circuit board of FIG. 2 with two of the daughter cards of FIG. 2;

FIG. 4 is a fragmentary transverse cross-sectional view of the daughter card and circuit board of FIG. 3 showing an optional use of thermally conductive compliant materials;

FIG. 5 is a fragmentary perspective view of a daughter card built in accordance with an alternative version of the first embodiment in an exploded relationship with the circuit board of FIG. 2;

FIG. 6 is a fragmentary perspective view of the daughter card of FIG. 2 in an exploded relationship with a circuit board built in accordance with an alternative version of the first embodiment;

FIG. 7 is a fragmentary transverse cross-sectional view of a circuit board and of two daughter cards built in accordance with a second embodiment of the invention;

DETAILED DESCRIPTION OF THE INVENTION

Figure 8:
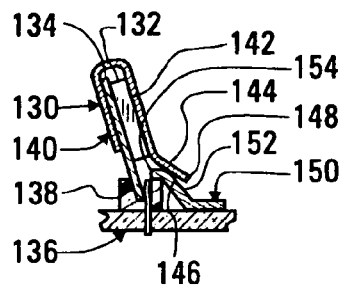
FIG. 8 is a fragmentary transverse cross-sectional view of a circuit board and a partially installed daughter card built in accordance with a third embodiment of the invention.

A first embodiment of the invention will first be explained with reference being made to FIGS. 1–3. FIG. 1 is a perspective view of a daughter card 10, built in accordance with this first embodiment of the invention, including a spring member 12 shown in an exploded relationship with a circuit card assembly 14. FIG. 2 is a perspective view of the daughter card 10 in an exploded relationship with a circuit board 16, additionally built in accordance with the first embodiment of the invention. FIG. 3 is a transverse cross sectional view of an assembly including the circuit board 16 and two of the daughter cards 10.

Within the daughter card 10, the circuit card assembly 14 includes a circuit card 18 having a number of circuit modules 20 extending along a first side 22 and a number of circuit modules 24 extending along the second side 26, opposite the first side 22. The circuit card assembly 14 also includes a connection edge 26 having a number of contact terminals 28. At each end, the circuit card 18 has an inward-extending notch 30. When the spring member 12 is slid into place over the circuit card assembly 14, thermal contact is made between the outer surface 32 of each of the circuit modules 20, 24 and the spring member 12, so that heat is transferred from the modules 20, 24 to the spring member 12. The spring member 12 includes a pair of tabs 34 that are formed to extend within the notches 30 after the spring member 12 is slid into place, with these formed tabs 34 then holding the spring member 12 in place on the card assembly 14.

The circuit board 16 includes a pair of connectors 36 for releasably engaging the connection edge 26 of the daughter card 10 so that electrical connections are made between individual contact terminals 38 of the connectors 36 and corresponding individual contact terminals 28 of the daughter card 10, completing connections between electrical circuits extending within the daughter card 12 and electrical circuits extending within the circuit board 16.

The circuit board 16 further includes a first thermal bus 40, having a thermal contact structure 42 releasably engaging a thermal contact structure 44 at the first side 20 of one of the daughter cards 10. Specifically, the thermal contact structure 42 of the first thermal bus 40 includes a thermal contact surface 46 inclined inwardly toward an edge 48 of the first thermal bus 40, engaging a thermal contact surface 50 of the spring member 12, which is inclined outwardly toward an edge 52 of the spring member 12.

The circuit board 16 additionally includes a second thermal bus 54, having a thermal contact structure 56 releasably engaging a thermal contact structure 58 at the second side 24 of the daughter card 10 and a thermal contact structure 60 releasably engaging a thermal contact structure 62 at the first side 64 of an adjacent daughter card 10. Specifically, the thermal contact structures 56, 62 each include a thermal contact surface 66 inclined outwardly toward an edge 68 of the second thermal bus 54, engaging one of the thermal contact surfaces 50 of the spring member 12 of the daughter cards 10.

Latches 70, pivotally mounted at both ends of the connector 36, are pivoted inward, in the direction of arrow 72, as one of the daughter cards 10 is installed in the connector 36. In this way, the tip 74 of each of the latches 70 enters a corresponding notch 30 in the daughter card to hold the connection edge 26 of the daughter card 10 in place within the connector 36 and to hold the thermal contact structures 44, 58 of the daughter card 10 in engagement with the thermal contact structures 42, 56 of the thermal buses 40, 54. When the daughter card 10 is removed from the connector 36, the latches 70 are manually pivoted outward, opposite the direction of arrow 72, releasing the tips 74 of the latches 70 from engagement with the notches 30 of the daughter card 10 so that the daughter card 10 can be removed from the connector 36. Additionally, as each latch 70 is rotated outward, a lower arm 76 of the latch pivots upward under the connection edge 26 of the daughter card 10, helping to push the daughter card 10 out of engagement with the connector 36.

Preferably, the notches 34 are deep enough to allow the engagement therein of the latch tips 74 even though a portion of each of the notches is occupied by a formed tab 34 of the spring member 12. Alternately, separate notches (not shown) may be provided for operation with the latches 70 and for holding the spring member 12 in place.

In the example of FIGS. 2 and 3, the circuit board 16 is shown as including two connectors 36 with a two first thermal buses 40 extending along the outer sides of the connectors 36 and with a single thermal bus 54 extending between the two connectors 36. In general, a number of the connectors 36 are preferably placed in a parallel, spaced apart relationship with one of the thermal buses 54 between each pair of adjacent connectors 36 and with a first thermal bus 40 extending adjacent the outer side of each of the outermost connectors 36.

FIG. 4 is a fragmentary transverse cross-sectional view of one of the daughter cards 10 and circuit board 16, showing an optional use of layers of thermally conductive compliant materials, such as thermal greases or thermal adhesives, which may be used to increase the level of heat transfer in spite of variations in the dimensions of the surfaces involved. In this context, "compliant" is used to describe a material forming a layer that is easily deformed to fill the space between two other, relatively hard surfaces. A first layer 80 of compliant thermally conductive material is placed between the outer surface 32 of each of the circuit modules 20, 24 and the spring member 12. A second layer 82 of compliant thermally conductive material is placed between each thermal contact surface 46, 56 of the thermal bus 40 and a corresponding contact surface 50 of the spring member 12, and between each thermal contact surface 66 of the second thermal bus 54 and a corresponding contact surface 60 of the spring member 12. Preferably, if a thermally conductive adhesive is used, it is allowed to dry as a coating on one side of the surfaces to be engaged to provide for the subsequent removal and replacement of a daughter card 10. For example, the adhesive may be allowed to dry on the thermal contact surfaces 46, 56, 66 of the thermal buses 40, 54 before the daughter cards 10 are installed.

Another method for promoting intimate contact between mating thermal contact surfaces is to divide one of the mating surfaces into a number of tabs that are individually flexed to provide contact with the other surface. FIG. 5 is a fragmentary perspective view showing a first application of this method, with a spring member 86 being divided into a number of tabs 88 to individually contact the thermal contact surfaces 46, 66 of the thermal buses 40, 54. FIG. 6 is a fragmentary perspective view showing a second application of this method, with contact surfaces of a first thermal bus 90 being divided into a number of tabs 92, and with contact surfaces of a second thermal bus 94 being divided into a number of tabs 96, to individually engage the thermal contact surfaces 50 of the daughter card 10.

FIG. 7 is a fragmentary transverse cross-sectional view of a pair of daughter cards 100, built in accordance with a second embodiment of the invention, installed on a circuit board 102, also built in accordance with the second embodiment of the invention. The daughter cards 100 are similar to the daughter cards 10, previously described in reference to FIGS. 1–3, except that the spring members 104 of the daughter cards 100 include thermal contact structures 106 having thermal contact surfaces 108, each extending inward, toward the connectors 110 of the circuit board 102, and toward an edge 112 of the spring member 104. The circuit board 102 is similar to the circuit board 16, previously described in reference to FIGS. 1–3, except that the first thermal buses 114 include thermal contact structures 116 having thermal contact surfaces 118, each extending outward, away from the connectors 110, and toward an edge 120 of the thermal bus 114, and that the second thermal bus 122 includes thermal contact structures 124 having thermal contact surfaces 126 extending outward, away from the connectors 110, and toward an edge 128 of the thermal bus 122.

For example, the daughter cards 10, 100 described above in reference to FIGS. 1–7 may be memory cards, such as 168-pin DIMM (dual in-line memory module) cards including memory modules on each side.

Figure 9:
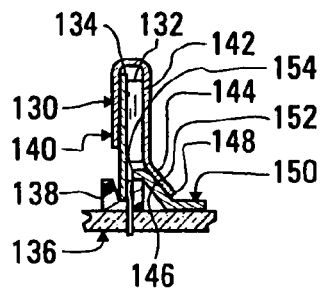
FIG. 9 is a fragmentary transverse cross-sectional view of the circuit board of FIG. 8 with the daughter card of FIG. 8 fully installed thereon.

A second embodiment of the invention, including a daughter card 130 having circuit modules 132 extending along only one side of a circuit card 134, will now be discussed with reference being made to FIGS. 8 and 9. For example, such a daughter card 130 may be a 30-pin SIMM (single in-line memory module) card with memory modules extending along only one side. FIGS. 8 and 9 are fragmentary transverse cross-sectional views of the daughter card 130 and of an associated circuit board 136, with FIG. 8 showing the daughter card 130 partially installed within a connector 138 on the circuit board 136, and with FIG. 9 showing the daughter card 130 fully installed within the connector 138.

The daughter card 130 includes a spring member 140, along which thermal contact is made by an outer surface 142 of the circuit modules 132, so that heat is transferred from the modules 132 to the spring member 140. The spring member 140 also includes a thermal contact structure 144 having a thermal contact surface 146 inclined outwardly toward an edge 148 of the spring member 140. The circuit board 136 includes a thermal bus 150 with a thermal contact structure 152 inclined inwardly toward the connector 138 and toward an edge 154 of the thermal bus 150.

For example, after the daughter card 130 is partially installed as shown in FIG. 8, the daughter card 130 is pivoted in the direction of arrow 152 into the position shown in FIG. 9, to be held in place by a latching mechanism (not shown) at each end of the daughter card 130. This motion brings the thermal contact surface 146 of the daughter card 130 into engagement with the contact surface 154 of the thermal bus 150.

Figure 10:
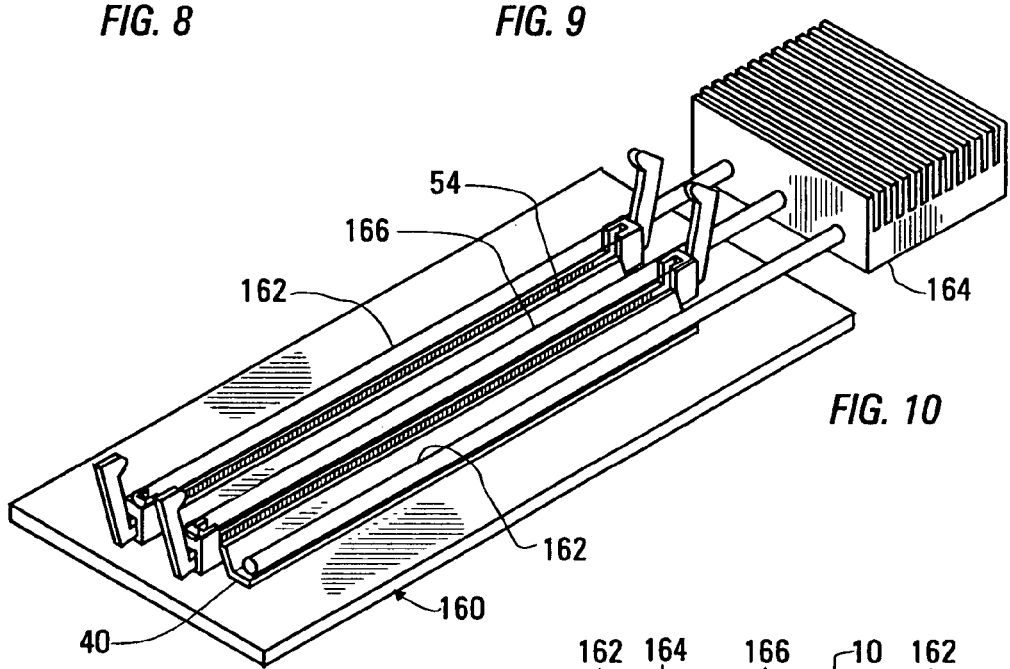
FIG. 10 is a perspective view of a circuit board built in accordance with a variation of the first embodiment of the invention.
Figure 11:
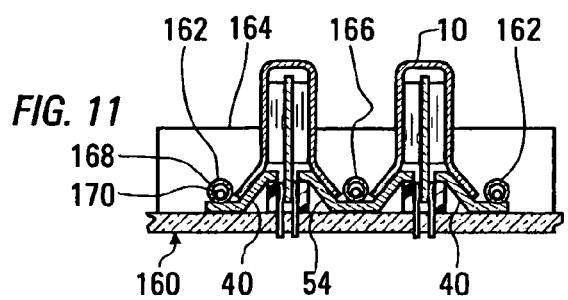
FIG. 11 is a fragmentary transverse cross-sectional view of the circuit board of FIG. 10 with two of the daughter cards of FIG. 1.

A circuit board 160, built in accordance with a variation of the first embodiment of the invention, will now be discussed, with reference being made to FIGS. 10 and 11. FIG. 10 is a perspective view of this circuit board 160, while FIG. 11 is a fragmentary cross-sectional view thereof. The circuit board 160 includes a first heat pipe 162 arranged to transmit heat from each of the first thermal buses 40 to a heat absorber 164 and a second heat pipe 166 arranged to transmit heat from the second thermal bus 54 to the heat absorber 164. For example, the heat absorber 168 may be a single heat sink, as shown, with each of the heat pipes 162, 166 extending within the heat sink to transfer heat to the heat sink, and with the heat sink being arranged to radiate heat into an air stream, a separate heat absorbing device for each of the heat pipes 162, 166, or a loop thermosyphon, as described in U.S. Pat. No. 6,657,121, the disclosure of which is included herein by reference. Other aspects of the thermal buses 40, 54 are as described above in reference to FIGS. 1–3, with these elements therefore being accorded like reference numbers.

Each of the heat pipes 162, 166 includes a closed tube 168 formed of a thermally conductive material, such as copper or a copper alloy, holding a wick 170, which extends substantially along the length of the closed tube 168, along with a two-phase vaporizable liquid, such as ammonia or a FREON compound or water at a low pressure. The boiling point of such a liquid can be held at a suitable level by controlling the amount of the material within the closed tube 168, so that suitable pressure levels are realized within the closed tube 168. The wick 170 is composed of a material capable of absorbing the vaporizable liquid in its liquid phase. Such materials are well known to those skilled in the art of designing heat pipes for the transfer of thermal energy. For example, the wick 170 may be formed as a sintered copper or felt metal wick structure or as a wick structure including aluminum silicon carbide or copper silicon carbide. Each of the closed tubes 168 is attached to the adjacent thermal bus 40, 54 by means providing for heat transfer, such as soldering or mechanical clamping.

The connectors 36 of the circuit board 160 removably accept the daughter cards 10, which have been described in reference to FIGS. 1–3. Heat generated by the circuit modules 20, 24 of these daughter cards 10 is transferred through the associated thermal buses 40, 54 to the associated heat pipes 162, 166, causing the evaporation of some of the two-phase vaporizable liquid within the heat pipes 162, 166. At the end of the heat pipes 162, 166, the cooling provided by the heat absorber 164 causes a portion of the vapor from two-phase vaporizable liquid to recondense. The wick carries the condensed liquid along the heat pipe 162, 166, reducing the concentration of the liquid at the heat absorber 164 and returning liquid to be again vaporized by heat derived from the circuit modules 20, 24.

While the features of embodiments and of variations have been separately described, it is understood that such features can be readily combined in accordance with the invention. For example, the use of compliant materials to facilitate the transfer of heat between adjacent surfaces may alternately be applied to the embodiments described in reference to FIGS. 7–9, or in a system including heat pipes, as described in reference to FIGS. 10 and 11. The heat pipes described in reference to FIGS. 10 and 11, may readily be applied to the thermal buses described in reference to FIGS. 7–9.

While the invention has been shown and described in its preferred embodiments and versions with some degree of particularity, it is understood that this description has been given only by way of example, and that numerous changes in the combination and arrangement of parts may be made without departing from the spirit and scope of the invention, as defined in the appended claims.

What is claimed is:

1. A circuit board comprising:
   a first connector for releasably engaging a connection edge of a daughter card, having a plurality of contact terminals for contacting a plurality of contact terminals of the daughter card; and
   a first thermal bus extending adjacent a first side of the first connector, having a thermal contact structure for releasably engaging a thermal contact structure of a daughter card held within the first connector.

2. The circuit board of claim 1, additionally comprising:
   a heat absorber, and
   a first heat pipe attached to the first thermal bus to receive heat from the first thermal bus and attached to the heat absorber to transmit heat to the heat absorber.

3. The circuit board of claim 2, wherein the first heat pipe includes:
   a closed thermally conductive tube;
   a wick extending within the tube and along the tube; and
   a two-phase vaporizable liquid within the tube.

4. The circuit board of claim 1, wherein the thermal contact structure of the first thermal bus includes:
   a thermal contact surface extending adjacent the first connector; and
   a compliant, thermally conductive coating extending along the thermal contact surface.

5. The circuit board of claim 1, wherein the thermal contact structure of the first thermal bus includes a thermal contact surface inclined inwardly toward the first connector and toward an edge of the first thermal bus.

6. The circuit board of claim 1, wherein the thermal contact structure of the first thermal bus includes a thermal contact surface inclined outwardly away from the first connector and toward an edge of the first thermal bus.

7. The circuit board of claim 1, additionally comprising a second thermal bus extending along a second side, opposite the first side, of the first connector, having a thermal contact structure for releasably engaging a thermal contact structure of a daughter card held within the first connector at the second side of the first connector.

8. The circuit board of claim 7, additionally comprising a second connector for releasably engaging a connection edge of a daughter card, having a plurality of contact terminals for contacting a plurality of contact terminals of the daughter card,
   wherein the second connector extends parallel to the first connector, and in a spaced-apart relationship with the first connector,
   wherein the second thermal bus extends between the first and second connectors, and
   wherein the second thermal bus additionally has a thermal contact structure for contacting a plurality of contact terminals of a daughter card engaging the second connector.

9. The circuit board of claim 8, additionally comprising:
   a heat absorber;
   a first heat pipe attached to the first thermal bus to receive heat from the first thermal bus and attached to the heat absorber to transmit heat to the heat absorber; and
   a second heat pipe attached to the second thermal bus to receive heat from the second thermal bus and attached to the heat absorber to transmit heat to the heat absorber.

10. The circuit board of claim 8, wherein each heat pipe includes:
a closed thermally conductive tube;
a wick extending within the tube and along the tube; and
a two-phase vaporizable liquid within the tube.

11. The circuit board of claim 8, wherein
the thermal contact structure of the first thermal bus includes a thermal contact surface extending adjacent the first connector and a compliant, thermally conductive coating extending along the thermal contact surface, and
the thermal contact structure of the second thermal bus includes a first thermal contact surface extending adjacent the first connector, a second thermal contact surface extending adjacent the second connector, and a compliant, thermally conductive coating extending along each of the first and second thermal contact surfaces.

12. The circuit board of claim 8, wherein
the thermal contact structure of the first thermal bus includes a thermal contact surface extending adjacent the first connector and a compliant, thermally conductive coating extending along the thermal contact surface, and
the thermal contact structure of the second thermal bus includes a first thermal contact surface extending adjacent the first connector, a second thermal contact surface extending adjacent the second connector, and a compliant, thermally conductive coating extending along each of the first and second thermal contact surfaces.

13. Apparatus comprising:
a daughter card including a connection edge, a plurality of contact terminals extending along the connection edge, a circuit module, and a spring member extending along a surface of the circuit module to absorb heat from the circuit module, wherein the spring member includes a thermal contact structure extending adjacent the connection edge; and
a circuit board including a first connector releasably engaging the connection edge of the daughter card and having a plurality of contact terminals electrically contacting the plurality of contact terminals of the daughter card, and a first thermal bus extending adjacent the first connector, having a thermal contact structure releasably engaging the thermal contact structure of the daughter card as the first connector releasably engages the connection edge of the daughter card.

14. The apparatus of claim 13, additionally comprising:
a heat absorber, and
a first heat pipe attached to the first thermal bus to receive heat from the first thermal bus and attached to the heat absorber to transmit heat to the heat absorber.

15. The apparatus of claim 14, wherein the first heat pipe includes:
a closed thermally conductive tube;
a wick extending within the tube and along the tube; and
a two-phase vaporizable liquid within the tube.

16. The apparatus of claim 13, wherein the thermal contact structure of the first thermal bus includes:
a thermal contact surface extending adjacent the first connector; and
a compliant, thermally conductive coating extending along the thermal contact surface.

17. The apparatus of claim 13, wherein
the circuit module is disposed along a first side of the daughter card, and
the spring member includes a first side extending outwardly from the circuit module along the first side of the daughter card, a second side extending along the second side, opposite the first side, of the daughter card, and an edge portion extending along an edge of the daughter card opposite the connection edge to connect the first and second sides of the spring member.

18. The apparatus of claim 17, wherein
the thermal contact structure of the spring member includes a first contact surface inclined outwardly toward an edge of the first side of the spring member, and
the thermal contact structure of the first thermal bus includes a first contact surface inclined inwardly toward an edge of the first thermal bus.

19. The apparatus of claim 17, wherein
the thermal contact structure of the spring member includes a first contact surface inclined inwardly toward an edge of the first side of the spring member, and
the thermal contact surface of the first thermal bus includes a first contact surface inclined outwardly toward an edge of the first thermal bus.

20. The apparatus of claim 17, wherein
the daughter card includes a first plurality of circuit modules extending along the first side, and
the first side of the spring member extends along a surface of each of the first plurality of circuit modules, outwardly from the circuit modules, to absorb heat from the circuit modules.

21. The apparatus of claim 17, wherein
the daughter card includes a pair of ends, each having an inward-extending notch, and
the spring member includes a pair of tabs extending into the inward-extending notches.

22. The apparatus of claim 17, additionally comprising a layer of thermally conductive conformable material between the circuit module and the first side of the spring member.

23. The apparatus of claim 17, wherein
the daughter card additionally includes a circuit module disposed along the second side of the daughter card, and
the second side of the spring member extends outwardly from the circuit module disposed along the second side of the daughter card,
the thermal contact structure of the first thermal bus contacts a portion of the thermal contact structure of the spring member adjacent the first side of the daughter card, and
the circuit board additionally includes a second thermal bus having a thermal contact structure contacting a portion of the thermal contact structure of the spring member adjacent the second side of the daughter card.

24. The apparatus of claim 23, wherein
the thermal contact structure of the spring member includes a first contact surface inclined outwardly toward an edge of the first side of the spring member and a second contact surface inclined outwardly toward an edge of the second side of the spring member,
the thermal contact structure of the first thermal bus includes a first contact surface inclined inwardly toward an edge of the first thermal bus, and
the thermal contact structure of the second contact surfaced includes a second contact surface inclined inwardly toward an edge of the second thermal bus.

25. The apparatus of claim 23, wherein
the thermal contact structure of the spring member includes a first contact surface inclined inwardly toward an edge of the first side of the spring member and a second contact surface inclined inwardly toward an edge of the second side of the spring member,
the thermal contact structure of the first thermal bus includes a first contact surface inclined outwardly toward an edge of the first thermal bus, and
the thermal contact structure of the second contact surfaced includes a second contact surface inclined outwardly toward an edge of the second thermal bus.

26. The circuit board of claim 23, additionally comprising:
a heat absorber;
a first heat pipe attached to the first thermal bus to receive heat from the first thermal bus and attached to the heat absorber to transmit heat to the heat absorber; and
a second heat pipe attached to the second thermal bus to receive heat from the second thermal bus and attached to the heat absorber to transmit heat to the heat absorber.

27. The apparatus of claim 17, wherein each heat pipe includes:
a closed thermally conductive tube;
a wick extending within the tube and along the tube; and
a two-phase vaporizable liquid within the tube.

28. The apparatus of claim 23, wherein
the daughter card includes a first plurality of circuit modules extending along the first side and a second plurality of circuit modules extending along the second side,
the first side of the spring member extends along a surface of each of the first plurality of circuit modules, outwardly from the circuit modules, to absorb heat from the circuit modules, and
the second side of the spring member extends along a surface of each of the second plurality of circuit modules, outwardly from the circuit modules, to absorb heat from the circuit modules.

29. The apparatus of claim 23, wherein
the daughter card includes a pair of ends, each having an inward-extending notch, and
the spring member includes a pair of tabs extending into the inward-extending notches.

30. The apparatus of claim 23, wherein
the circuit board additionally includes a second connector for releasably engaging a connection edge of a daughter card, including a plurality of contact terminals for electrically contacting contact terminals of the daughter card,
the second connector extends in a parallel relationship with the first connector,
the second thermal bus extends between the first connector and the second connector, and
the thermal contact structure of the second thermal bus additionally includes a second thermal contact surface for contacting a thermal contact structure of a daughter card releasably held within the second connector.

* * * * *